(12) United States Patent
Fujisawa et al.

(10) Patent No.: US 7,576,579 B2
(45) Date of Patent: Aug. 18, 2009

(54) DLL CIRCUIT AND SEMICONDUCTOR DEVICE INCLUDING THE SAME

(75) Inventors: Hiroki Fujisawa, Tokyo (JP); Ryuji Takishita, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 176 days.

(21) Appl. No.: 11/892,525

(22) Filed: Aug. 23, 2007

(65) Prior Publication Data

US 2008/0054959 A1  Mar. 6, 2008

(30) Foreign Application Priority Data

Aug. 31, 2006 (JP) .............................. 2006-234921

(51) Int. Cl.
*H03L 7/06* (2006.01)

(52) U.S. Cl. .................. 327/158; 327/149; 327/161; 327/245; 327/271; 365/233.12; 365/233.13

(58) Field of Classification Search ................ 327/149, 327/158, 161, 243–245, 269–271, 284, 291–293, 327/295; 365/233.1, 233.11–233.13
See application file for complete search history.

(56) References Cited

U.S. PATENT DOCUMENTS

| 5,184,027 | A | * | 2/1993 | Masuda et al. ............... 327/149 |
| 5,559,462 | A | * | 9/1996 | Tanoi ........................... 327/231 |
| 6,212,126 | B1 | | 4/2001 | Sakamoto |
| 6,570,815 | B2 | | 5/2003 | Kashiwazaki |
| 6,637,997 | B2 | | 10/2003 | Ahrns et al. |
| 6,700,414 | B2 | | 3/2004 | Tsujino |
| 6,707,330 | B2 | | 3/2004 | Nakanishi |
| 7,107,476 | B2 | | 9/2006 | Jeong et al. |
| 2007/0086267 | A1 | * | 4/2007 | Kwak ........................ 365/233 |

FOREIGN PATENT DOCUMENTS

| JP | 63-161795 | | 7/1988 |
| JP | 07-107122 | | 4/1995 |
| JP | 2001-060392 | A | 3/2001 |
| JP | 2002-324398 | A | 11/2002 |
| JP | 2003-159613 | A | 6/2003 |
| JP | 2003-163592 | A | 6/2003 |
| JP | 2003-167778 | A | 6/2003 |
| JP | 2003-198339 | A | 7/2003 |

* cited by examiner

*Primary Examiner*—Lincoln Donovan
*Assistant Examiner*—Patrick O'Neill
(74) *Attorney, Agent, or Firm*—Foley & Lardner LLP

(57) ABSTRACT

A DLL circuit includes a first delay adjusting circuit that adjusts an amount of delay of a frequency-divided signal CK1, a second delay adjusting circuit that adjusts an amount of delay of a frequency-divided signal CK2, a synthesizing circuit that synthesizes outputs of these delay adjusting circuits to generate an internal clock signal, and supplies the internal clock signal to a real path, a clock driver that receives the output of the first delay adjusting circuit and supplies the output to a replica path, and a clock driver that receives the output of the second delay adjusting circuit. These clock drivers have substantially the same circuit configuration. Accordingly, even when the power supply voltage fluctuates, influences of the fluctuations on the respective frequency-divided signals are almost equal. Thus, deterioration of the function of the DLL circuit due to fluctuations of the power supply voltage can be prevented.

7 Claims, 8 Drawing Sheets

DLL CIRCUIT AND SEMICONDUCTOR DEVICE INCLUDING THE SAME

TECHNICAL FIELD

The present invention relates to a DLL (Delay Locked Loop) circuit and a semiconductor device including the DLL circuit, and, more particularly to a multiphase DLL circuit that uses frequency-divided signals that is obtained by dividing a reference clock signal and a semiconductor device including the multiphase DLL circuit. The present invention also relates to a data processing system that includes a semiconductor device having the DLL circuit.

BACKGROUND OF THE INVENTION

Recently, synchronous memory devices that operate synchronized with a clock signal are widely used as main memory devices in personal computers and the like. Among them, a DDR (Double Data Rate) synchronous memory device requires input and output data being accurately synchronized with an external clock signal. Therefore, a DDL circuit for generating an internal clock signal that is synchronized with an external clock signal is necessary (see Japanese Patent Application Laid-open No. 2002-324398).

A single-phase DLL circuit commonly used is shown in FIG. 7.

As shown in FIG. 7, the single-phase DLL circuit has a delay adjusting circuit unit 10 that adjusts an amount of delay of an external clock signal CK, and a clock driver unit 20 that receives an internal clock signal LCLK outputted from the delay adjusting circuit unit 10. The clock driver unit 20 includes clock drivers 21 that supplies the internal clock signal LCLK to a real path 31 in a clock tree unit 30, and clock drivers 22 that supplies the internal clock signal LCLK to a replica path 32 in the clock tree unit 30.

The internal clock signal LCLK passed through the real path 31 is supplied to an output buffer 41 in a buffer circuit unit 40. The output buffer 41 is a circuit that outputs read data DRFIFO to an input/output data terminal DQ synchronized with the internal clock signal LCLK. The internal clock signal LCLK passed through the replica path 32 is supplied to a replica buffer 42. The replica buffer 42 is a circuit that outputs a replica clock signal RCLK synchronized with the internal clock signal LCLK.

The replica clock signal RCLK outputted from the replica buffer 42 is fed back to the delay adjusting circuit unit 10. The delay adjusting circuit unit 10 is configured by a phase detecting circuit 11 and a delay adjusting circuit 12. The replica clock signal RCLK is supplied to an inverting input terminal (−) of the phase detecting circuit 11. The external clock signal CK is supplied to a non-inverting input terminal (+) of the phase detecting circuit 11.

Accordingly, a feedback signal FB corresponding to a difference between an edge of the replica clock signal RCLK and an edge of the external clock signal CK is generated and supplied to the delay adjusting circuit 12. The delay adjusting circuit 12 adjusts an amount of delay of the internal clock signal LCLK based on the feedback signal FB so as to align the edge of the replica clock signal RCLK with the edge of the external clock signal CK.

The clock drivers 22 include a dividing circuit 51 and a delay adjusting circuit 52. The dividing circuit 51 is installed to frequency-divide the internal clock signal LCLK passing through the replica path 32 thereby to reduce power consumption. The delay adjusting circuit 52 is a circuit for canceling a difference between the read data appearing at the input/output data terminal DQ and the replica clock signal RCLK. That is, the output buffer 41 and the replica buffer 42 have a difference in the operation speeds resulting from a difference in the output loads, as well as a difference in the amounts of delay due to a dead zone of the phase detecting circuit 11. The delay adjusting circuit 52 is installed to cancel a difference in timing caused by these differences.

The single-phase DLL circuit is advantageous in that the circuit configuration is relatively simple. However, the single-phase DLL circuit has a disadvantage of not operating correctly when the frequency of the external clock signal CK is high, because the delay adjusting circuit unit 10 cannot keep up with the clock signal.

Such a problem can be solved by using a multiphase DLL circuit. A multiphase DLL circuit adjusts an amount of delay of the internal clock signal LCLK not by using the external clock signal CK as it is, but controls an amount of delay referring to a frequency-divided signal that is obtained by dividing the external clock signal CK. Accordingly, the delay adjusting circuit unit assures a sufficient operation speed, and thus it can operate correctly even when the frequency of the external cock CK is high.

In the multiphase DLL circuit, however, skew increases or duty varies easily when the power supply voltage fluctuates. The main cause is considered as follows: The multiphase DLL circuit frequency-divides an external clock signal CK into plural frequency-divided signals, and control an amount of delay with respect to each of these frequency-divided signals. Therefore, when the power supply voltage fluctuates, the influences on the respective frequency-divided signals are not equal.

SUMMARY OF THE INVENTION

It is therefore an object of the present invention to provide a multiphase DLL circuit in which few fluctuations in skew or duty are generated even when the power supply voltage fluctuates, and a semiconductor device using the multiphase DLL circuit.

The above and other objects of the present invention can be accomplished by a DLL circuit comprising:

a dividing circuit unit that frequency-divides a first clock signal to generate at least first and second frequency-divided signals having difference phases;

a first delay adjusting circuit that adjusts an amount of delay of the first frequency-divided signal based on a first feedback signal;

a second delay adjusting circuit that adjusts an amount of delay of the second frequency-divided signal based on a second feedback signal;

a synthesizing circuit that synthesizes at least outputs of the first and second delay adjusting circuits to generate a second clock signal, and supplies the second clock signal to a real path in a clock tree unit;

a first clock driver that receives the output of the first delay adjusting circuit and supplies the output to a replica path in the clock tree unit; and a second clock driver that receives the output of the second delay adjusting circuit, wherein the first clock driver and the second clock driver have substantially the same circuit configuration.

The first clock signal can be an external clock signal and the second clock signal can be an internal clock signal, but the first and second clock signals are not limited thereto.

The first feedback signal is preferably a signal indicating misalignment of edges between a third clock signal that is generated based on the first frequency-divided signal passed through the replica path, and the first clock signal. The second feedback signal is preferably a signal indicating duty of the second clock signal.

The above and other objects of the present invention can also be accomplished by a semiconductor device includes: the DLL circuit described above; an output buffer that outputs data synchronized with the second clock passed through the normal path; and a replica buffer that has substantially the same circuit configuration as the output buffer and outputs the third clock synchronized with the first frequency-divided signal passed through the replica path.

The semiconductor device according to the present invention preferably further includes a third delay adjusting circuit that is placed between the replica path and the replica buffer, and absorbs a difference in operation speeds between the output buffer and the replica buffer. In this case, it is preferable that the semiconductor device further include a power-supply terminal that is externally supplied with power supply voltage, and that a distance between the third delay adjusting circuit and the power-supply terminal is at least shorter than a distance between the first clock driver and the power-supply terminal.

According to the present invention, plural clock drivers that transmit frequency-divided signals have substantially the same circuit configuration. Therefore, even when the power supply fluctuates, the influences on the respective frequency-divided signals are nearly equal. Accordingly, deterioration of the function of the DLL circuit due to fluctuations of the power supply can be prevented.

Thus, the present invention is highly preferable in being applied to a semiconductor device that requires input and output data being accurately synchronized with an external clock signal, such as a DDR synchronous memory.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
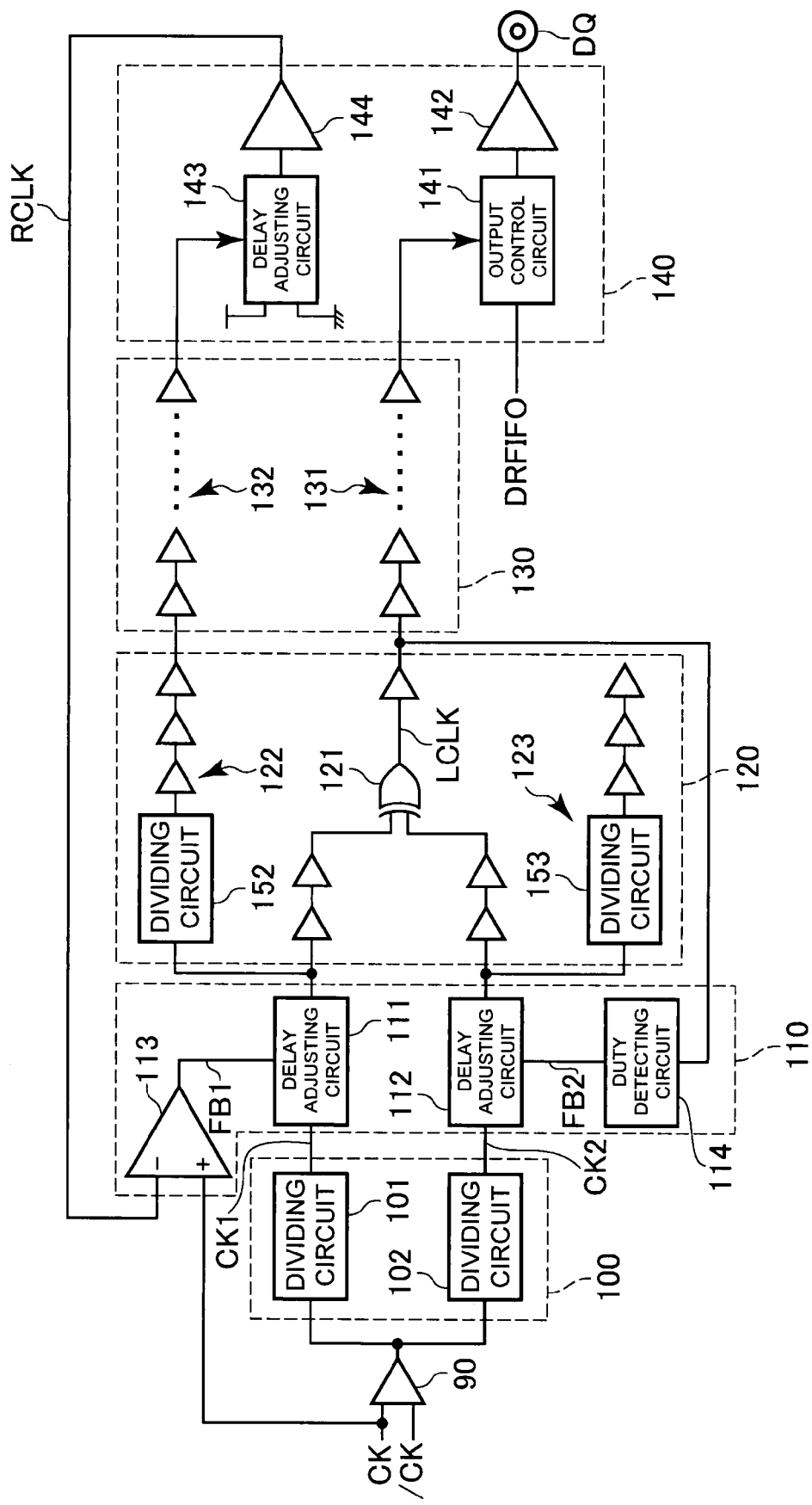
FIG. 1 is a block diagram showing a configuration of a DLL circuit according to a preferred embodiment of the present invention.

FIG. 1 is a block diagram showing a configuration of a DLL circuit according to a preferred embodiment of the present invention.

As shown in FIG. 1, the DLL circuit according to the present embodiment includes a dividing circuit unit 100, a delay adjusting circuit unit 110, and a clock driver unit 120.

The dividing circuit unit 100 includes a dividing circuit 101 that frequency-divides an external clock signal CK by two to generate a frequency-divided signal CK1, and a dividing circuit 102 that frequency-divides the external clock signal CK by two to generate a frequency-divided signal CK2. Precisely, the signal that is frequency-divided by the dividing circuits 101 and 102 is a signal that is obtained by comparing the external clock signal CK and an inverted signal /CK using a comparator 90. For convenience sake, an output of the comparator 90 is designated as the external clock signal CK.

The dividing circuits 101 and 102 generate the frequency-divided signals having difference phases. For example, when the dividing circuit 101 performs the frequency division trigged by a rising edge of the external clock signal CK, the dividing circuit 102 performs the frequency division trigged by a falling edge of the external clock signal CK. In this way, the frequency-divided signals CK1 and CK2 have phases that are shifted each other by 90°.

The delay adjusting circuit unit 110 includes a delay adjusting circuit 111 that adjusts an amount of delay of the frequency-divided signal CK1 based on a feedback signal FB1, and a delay adjusting circuit 112 that adjusts an amount of delay of the frequency-divided signal CK2 based on a feedback signal FB2. The feedback signal FB1 is generated by a phase detecting circuit 113, and the feedback signal FB2 is generated by a duty detecting circuit 114. Both of the frequency-divided signals CK1 and CK2 whose amounts of delay are adjusted by the delay adjusting circuits 111 and 112 are supplied to the clock driver unit 120.

The clock driver unit 120 includes a synthesizing circuit 121 that synthesize the frequency-divided signals CK1 and CK2 outputted from the delay adjusting circuits 111 and 112 to generate an internal clock signal LCLK. The synthesizing circuit 121 can be configured by an EXOR (exclusive OR) circuit. The internal clock signal LCLK outputted from the synthesizing circuit 121 is supplied to a real path 131 in a clock tree unit 130.

The clock driver unit 120 further includes two clock drivers 122 and 123. The clock driver 122 receives the frequency-divided signal CK1 outputted from the delay adjusting circuit 111, and supplies the received signal to a replica path 132 in the clock tree unit 130. The clock driver 123 receives the frequency-divided signal CK2 outputted from the delay adjusting circuit 112. The clock driver 123 has the same circuit configuration as the clock driver 122.

Figure 7:
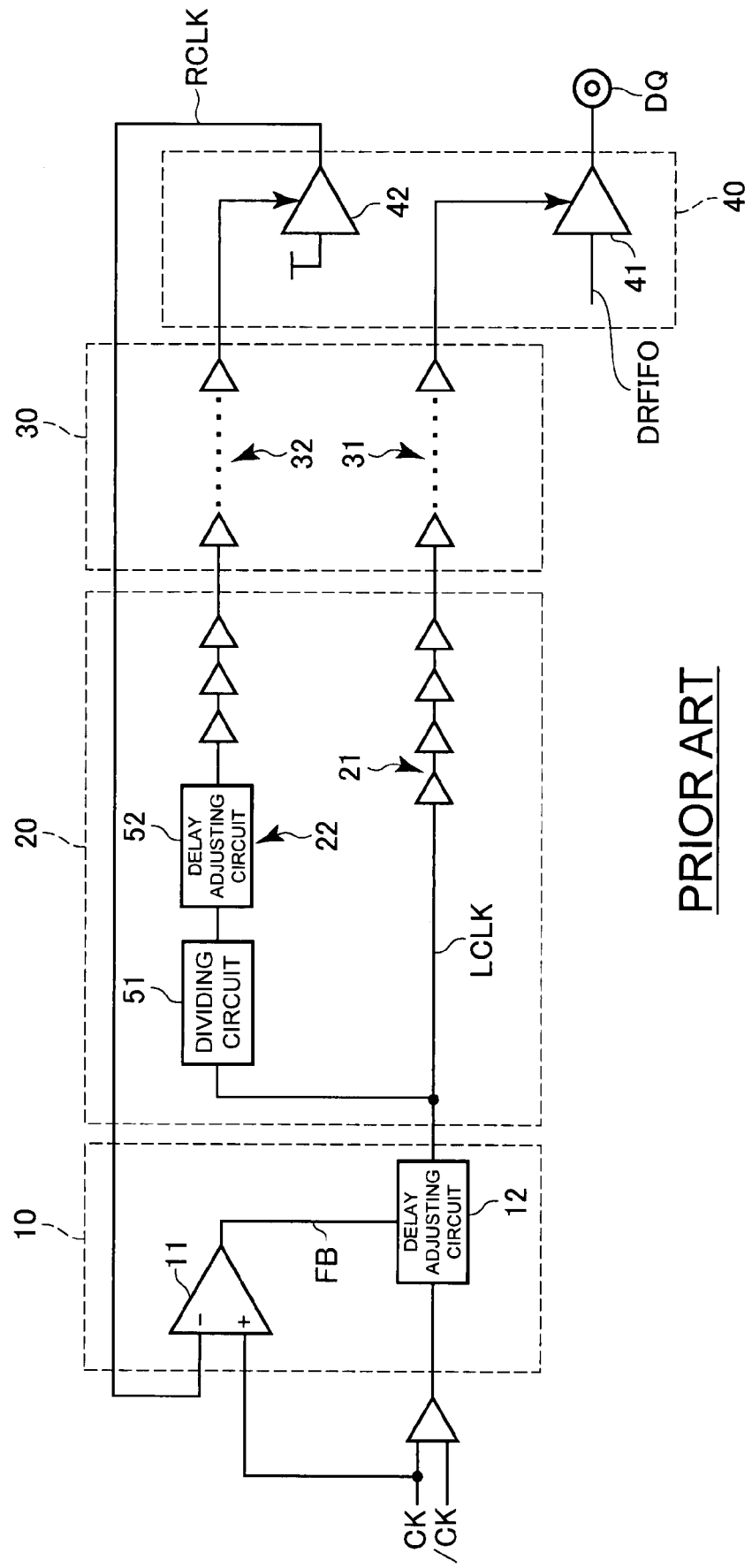
FIG. 7 is a block diagram of a single-phase DLL circuit commonly used.

The clock drivers 122 and 123 are provided with dividing circuits 152 and 153, respectively. The dividing circuit 152 additionally divides the frequency-divided signal CK1 that passes through the replica path 132 to reduce power consumption. Therefore, the dividing circuit 152 is not essential for the present invention. Of course, when the dividing circuit 152 is omitted, the dividing circuit 153 must be omitted, so that the clock drivers 122 and 123 have the same circuit configuration. Unlike the DLL circuit as shown in FIG. 7, no delay adjusting circuit is provided in the clock driver 122.

The clock driver 123 is provided so as to match loads of the frequency-divided signals CK1 and CK2, and its output is not used. That is, the clock driver 123 is a dummy circuit. To achieve such an object, the clock driver 123 can be replaced by a dummy capacitor. As described below, however, the load of the clock driver 122 fluctuates according to power supply voltages, while the dummy capacitor does not produce such fluctuations. Thus, when the clock driver 123 is replaced by the dummy capacitor, the loads of the frequency-divided signals CK1 and CK2 are not equal when the power supply voltage varies. Considering such a case, the clock driver 123 having the same circuit configuration as the clock driver 122 is employed.

The internal clock signal LCLK passed through the real path 131 in the clock tree unit 130 is supplied to an output control circuit 141 included in a buffer circuit unit 140. Based on the internal clock signal LCLK, the output control circuit 141 controls timing of supplying read data DRFIFO to an output buffer 142, and the like. An output from the output buffer 142 is supplied to an input/output data terminal DQ.

Meanwhile, the frequency-divided signal CK1 passed through the replica path 132 in the clock tree unit 130 is supplied to a replica buffer 144 through a delay adjusting circuit 143. The replica buffer 144 is a circuit that outputs a replica clock signal RCLK synchronized with the frequency-divided signal CK1, and has substantially the same circuit configuration as the output buffer 142. The output buffer 142 performs outputting corresponding to read data, while the replica buffer 144 performs clock signal outputting synchronized with the frequency-divided signal CK1.

The delay adjusting circuit 143 is a circuit for canceling a difference in timing between read data appearing at the input/output data terminal DQ and the replica clock signal RCLK. As described above, the output buffer 142 and the replica buffer 144 have a difference in the operation speed resulting from a difference in the output loads, and also have a difference in the amount of delay due to a dead zone of the phase detecting circuit 113. The delay adjusting circuit 143 is provided to cancel the difference in timing caused by these differences.

In the DLL circuit as shown in FIG. 7, the circuit like the delay adjusting circuit 143 is provided in the clock driver unit. However, when the delay adjusting circuit 143 is placed in the clock driver unit 120, the circuit configurations of the clock drivers 122 and 123 differ. Considering this point, the delay adjusting circuit 143 is placed in the buffer circuit unit 140 in the present embodiment. As described below, an output control circuit corresponding to the replica buffer 144 is omitted in this embodiment. The delay adjusting circuit 143 is placed in an unoccupied space where the output control circuit is to be located.

The replica clock signal RCLK outputted from the replica buffer 144 is fed back to an inverting input terminal (−) of the phase detecting circuit 113. The external clock signal CK is supplied to a non-inverting input terminal (+) of the phase detecting circuit 113.

In this way, the feedback signal FB1 corresponding to a difference between an edge of the replica clock signal RCLK and an edge of the external clock signal CK is generated by the phase detecting circuit 113, and supplied to the delay adjusting circuit 111. The delay adjusting circuit 111 adjusts an amount of delay of the frequency-divided signal CK1 based on the feedback signal FB1 so as to align the edge of the replica clock signal RCLK and the edge of the frequency-divided signal CK1.

Since the frequency-divided signal CK1 is a signal that is obtained by frequency-dividing the external clock signal CK by two, the delay adjusting circuit 111 cannot perform adjustment with respect to both edges (the rising edge and the falling edge) of the external clock signal CK. That is, the delay adjusting circuit 111 adjusts an amount of delay of the frequency-divided signal CK1 so as to align one of the edges (for example, the rising edge) of the external clock signal CK and the edge of the frequency-divided signal CK1.

Meanwhile, the internal clock signal LCLK generated by the synthesizing circuit 121 is supplied to the duty detecting circuit 114. The duty detecting circuit 114 detects duty of the internal clock signal LCLK, i.e., a time period during which the internal clock signal LCLK has a high level. Based on the detection result, the duty detecting circuit 114 generates the feedback signal FB2. The feedback signal FB2 is supplied to the delay adjusting circuit 112.

The delay adjusting circuit 112 adjusts an amount of delay of the frequency-divided signal CK2 based on the feedback signal FB2. For example, when the duty of the internal clock signal LCLK is too small, the amount of delay of the frequency-divided signal CK2 is increased. When the duty of the internal clock signal CLCK is too large, the amount of delay of the frequency-divided signal CK2 is reduced.

The frequency-divided signals CK1 and CK2 whose amounts of delay are adjusted are synthesized by the synthesizing circuit 121 as mentioned above, to generate the internal clock signal LCLK. Thus, the rising edge of the internal clock signal LCLK is adjusted correctly under control of the delay adjusting circuit 111. The duty of the internal clock signal LCLK is adjusted correctly under control of the delay adjusting circuit 112.

Figure 2:
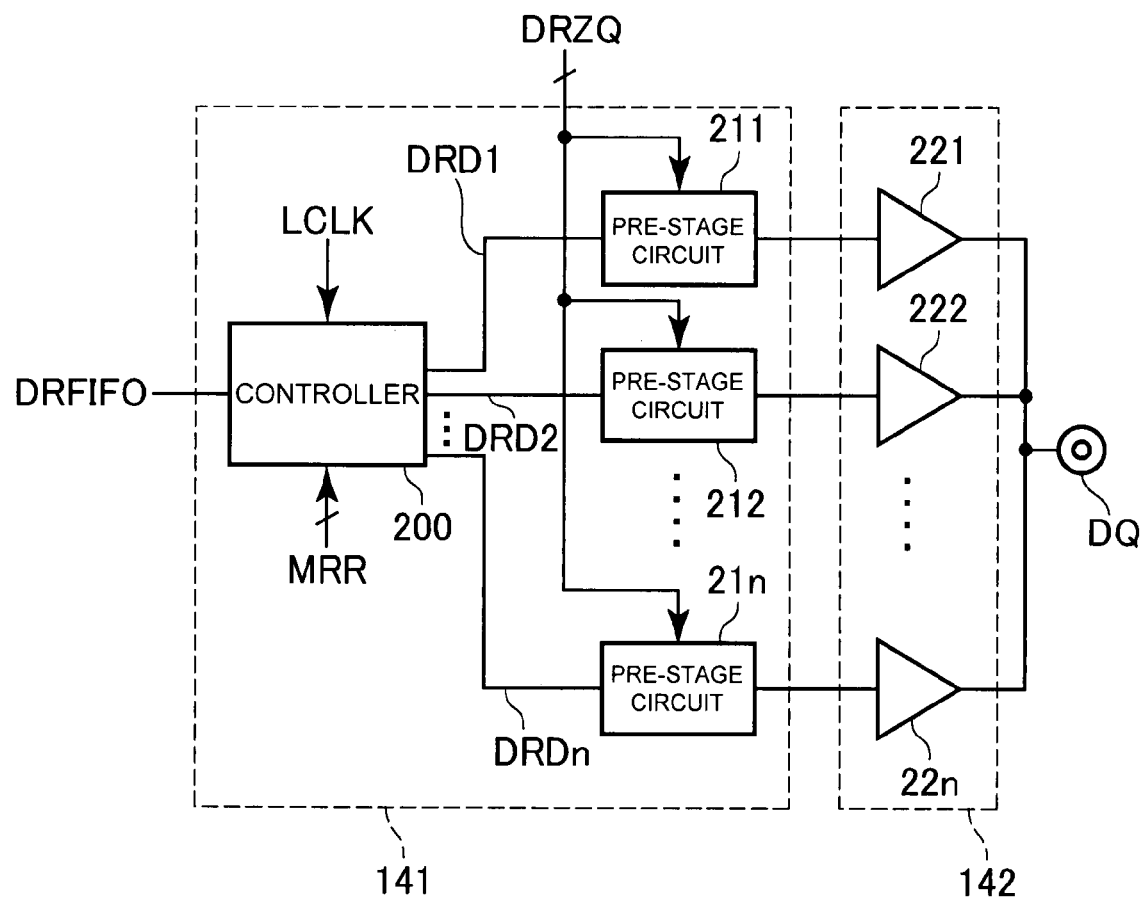
FIG. 2 is a block diagram showing detailed configurations of the output control circuit and the output buffer shown in FIG. 1.

FIG. 2 is a block diagram showing detailed configurations of the output control circuit 141 and the output buffer 142.

As shown in FIG. 2, the output control circuit 141 includes a controller 200 that receives the read data DRFIFO, and pre-stage circuits 211 to 21n that receive sub read data DRD1 to DRDn, respectively, outputted from the controller 200. The output buffer 142 includes unit buffers 221 to 22n corresponding to the pre-stage circuits 211 to 21n, respectively.

Based on the read data DRFIFO, the controller 200 activates at least one of the sub read data DRD1 to DRDn synchronized with the internal clock signal LCLK. Which one of the sub read data DRD1 to DRDn is to be activated is specified by a selection signal MRR.

The sub read data DRD1 to DRDn are supplied to the corresponding pre-stage circuits 211 to 21n. The pre-stage circuits 211 to 21n drive the corresponding unit buffers 221 to 22n when the corresponding sub read data DRD1 to DRDn are activated. Therefore, when impedance of the output buffer 142 is set at a low value, the number of the sub read data DRD1 to DRDn that are simultaneously activated using the selection signal MRR is increased, thereby increasing the number of the unit buffers 221 to 22n operating in parallel. When the impedance of the output buffer 142 is set at a high value, the number of the sub read data DRD1 to DRDn that are simultaneously activated is decreased, thereby reducing the number of the unit buffers 221 to 22n operating in parallel.

An impedance control signal DRZQ is supplied to the pre-stage circuits 211 to 21n. That is, the unit buffers 211 to 22n are configured so as to finely adjust the impedance. A signal that specifies the impedance of the unit buffers 221 to 22n is the impedance control signal DRZQ.

Meanwhile, as shown in FIG. 1, the replica buffer 144 is not provided with the output control circuit 141. To be precise, a circuit for activating the replica buffer 144 synchronized with the frequency-divided signal CK1, i.e., a circuit corresponding to a part of the controller 200 as shown in FIG. 2 is provided. However, other circuits such as pre-stage circuits for finely adjusting impedance of the replica buffer 144 are omitted. Accordingly, an area corresponding to the output control circuit 141 is unoccupied, and the delay adjusting circuit 143 is placed in this area. As described above, the delay adjusting circuit 143 is a circuit for canceling a difference in timing between the read data appearing at the input/output data terminal DQ and the replica clock signal RCLK.

Figure 3:
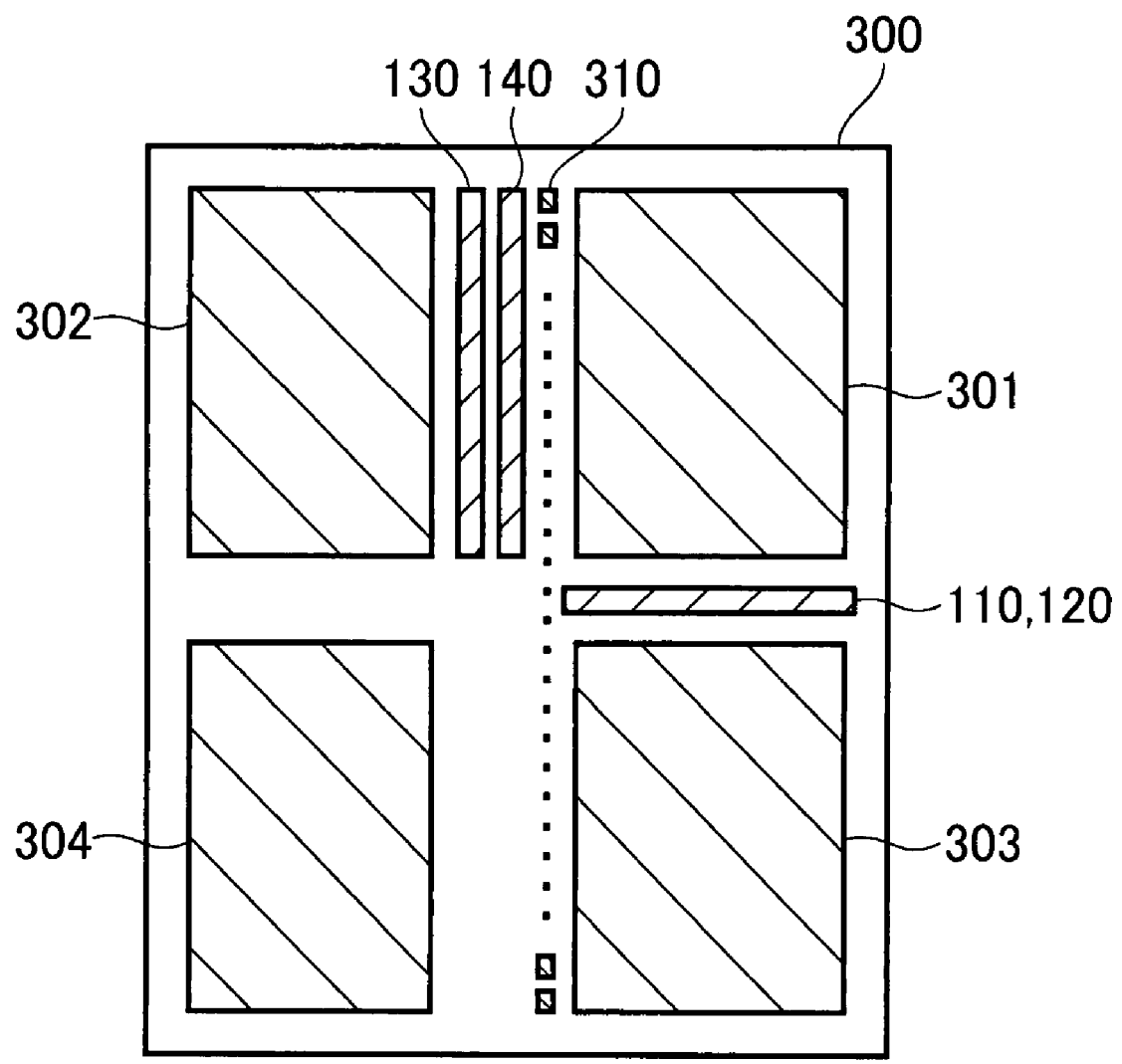
FIG. 3 is a schematic plan view for explaining a layout of a semiconductor device that includes a DLL circuit shown in FIG. 1.

FIG. 3 is a schematic plan view for explaining a layout of a semiconductor device 300 that includes a DLL circuit according to the present embodiment.

The semiconductor device 300 shown in FIG. 3 is for example a DDR synchronous DRAM, and includes four memory cell areas 301 to 304. A space between the memory cell areas 301 and 302 and a space between the memory cell areas 303 and 304 are used for a pad row 310 in which plural pads including an input/output data terminal DQ and a power-supply terminal are arranged.

In the semiconductor device 300 having this configuration, most part of the delay adjusting circuit unit 110 and the clock driver unit 120 configuring the DLL circuit according to the present embodiment is placed in an area between the memory cell areas 301 and 303. The clock tree unit 130 and the buffer circuit unit 140 are placed in an area between the memory cell areas 301 and 302.

Figure 4:
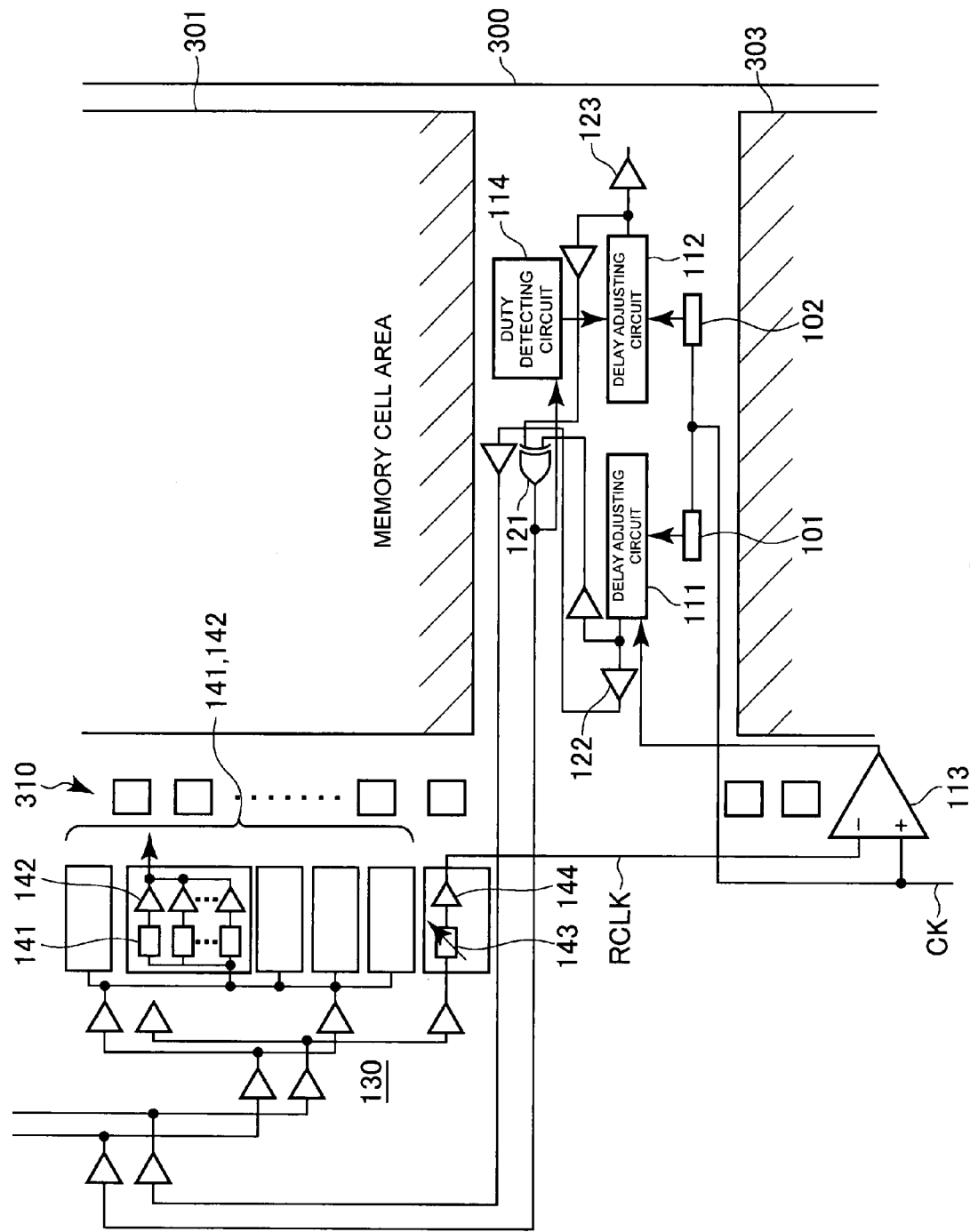
FIG. 4 is an enlarged view of a detailed layout of the DLL circuit in the semiconductor device shown in FIG. 3.

FIG. 4 is an enlarged view of a detailed layout of the DLL circuit in the semiconductor device 300.

As shown in FIG. 4, the area between the memory cell areas 301 and 303 has an elongated shape in the transverse direction. Therefore, a path that transmits the frequency-divided signal CK1 and a path that transmits the frequency-divided signal CK2 are arranged side by side in the transverse direction. These paths are arranged in a symmetrical layout. Although not shown, power supply lines that supply power to these paths are also arranged symmetrically. Accordingly, these paths have the same length, and influences of fluctuations of the power supply voltage or noises in the power supply on the frequency-divided signals CK1 and CK2 are made equal.

Since the area between the memory cell areas 301 and 303 has a transversely elongated shape, the distance from the pad row 310 is long. Therefore, the power supply voltage is liable to fluctuate in this area. Thus, when the delay adjusting circuit 143 is placed near the clock driver 122 as in the DLL circuit as shown in FIG. 7, the amount of adjustment changes due to fluctuations of the power supply voltage. Considering this point, in the present embodiment, the delay adjusting circuit 143 is placed in an area near the pad row 310 where few fluctuations of the power supply are produced, as shown in FIG. 4. In this way, accuracy in the amount of delay adjusted by the delay adjusting circuit 143 is assured.

As described above, the dummy capacitor is not used but the clock driver 123 having the same circuit configuration as the clock driver 122 is used. Therefore, even when the power supply may fluctuate in this area, the influences on the frequency-divided signals CK1 and CK2 are almost equal. Accordingly, changes in the operation characteristics of the DLL circuit due to the fluctuations of the power supply are reduced.

Figure 5:
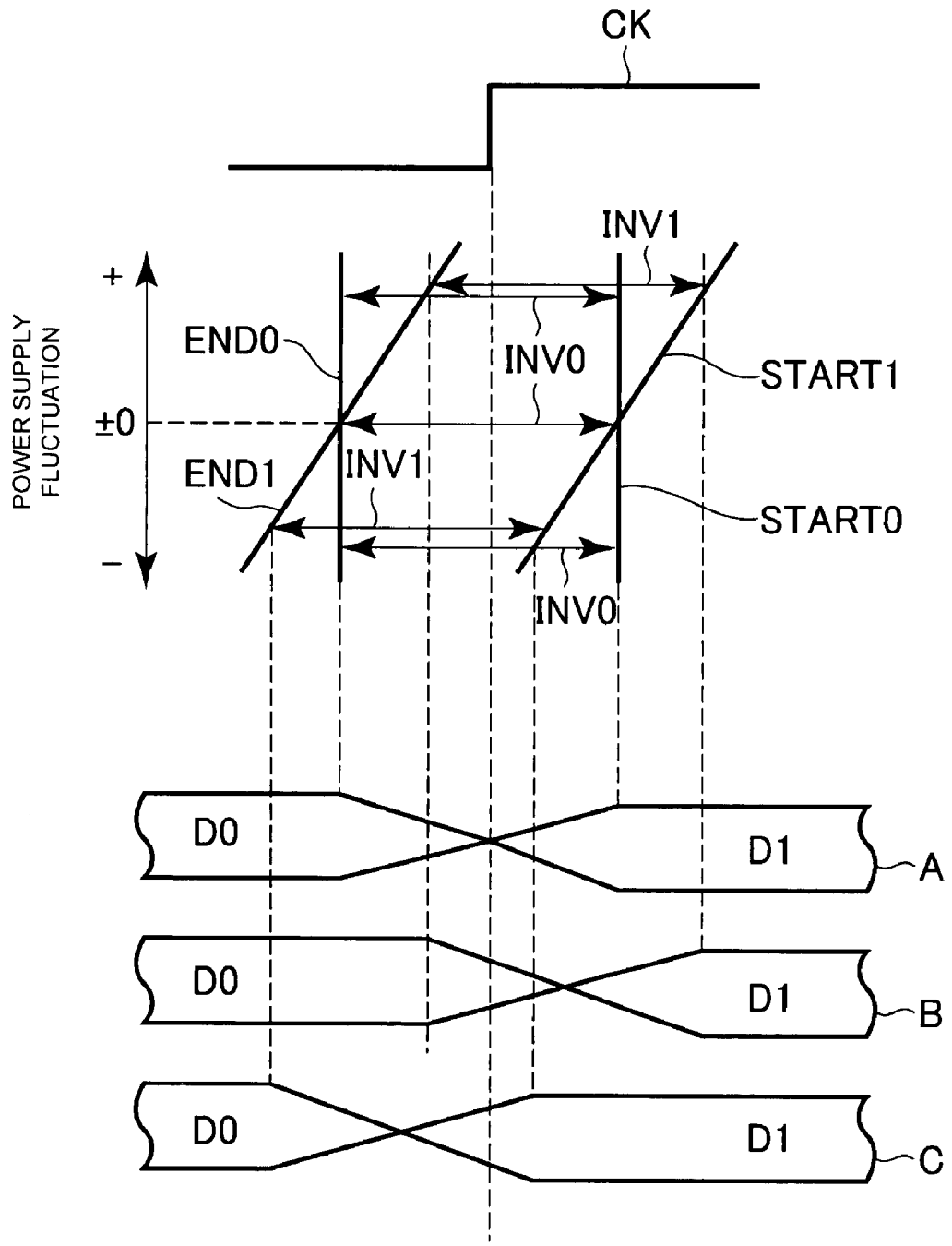
FIG. 5 is a timing chart for explaining changes of a time period during which the read data are invalid, according to the power supply voltage.

FIG. 5 is a timing chart for explaining changes of a time period during which the read data are invalid, according to the power supply voltage.

A synchronous DRAM outputs read data synchronized with the external clock signal CK. Therefore, the read data change at an edge (both edges in the case of a DDR synchronous DRAM) of the external clock signal CK. A certain time period is needed to change the read data. To correctly synchronize output timing of the read data with the external clock signal CK, it is important that the invalid period is set to be symmetrical with respect to the edge of the external clock signal CK.

As shown in FIG. 5, when the power supply voltage has a desired value, an invalid period INV0 at a power supply fluctuation (±0) is designed so as to be symmetrical with respect to the edge of the external clock signal CK. The invalid period INV0 is defined by a time period between an output end time END0 of the read data D0 and an output start time START0 of the subsequent read data D1, as indicated by a reference character A.

In the DLL circuit according to the present embodiment, the output end time END0 and the output start time START0 hardly depend on the power supply voltage, as shown in FIG. 5. Thus, the invalid period INV0 is constantly symmetrical with respect to the edge of the external clock signal CK even when the power supply voltage fluctuates. That is, switching from the read data D0 to the read data D1 is correctly performed synchronized with the edge of the external clock signal CK, without being affected by the fluctuations of the power supply.

On the other hand, assuming that the clock driver 123 is replaced by the dummy capacitor, the output end time END1 and the output start time START1 greatly vary according to the power supply voltage, as shown in FIG. 5. More specifically, when the power supply voltage is high (power supply fluctuation (+)), both of the output end time END1 and the output start time START1 are delayed. Accordingly, as indicated by a reference character B, switching from the read data D0 to the read data D1 is delayed with respect to the edge of the external clock signal CK. When the power supply voltage is low (power supply fluctuation (−)), both of the output end time END1 and the output start time START1 are made earlier. Thus, as indicated by a reference character C, switching from the read data D0 to the read data D1 is performed earlier than the edge of the external clock signal CK.

Such deviation deteriorates the signal quality of read data. In the DLL circuit according to the present embodiment, such deviation hardly occurs. Therefore, a high quality of signal is achieved.

Figure 6:
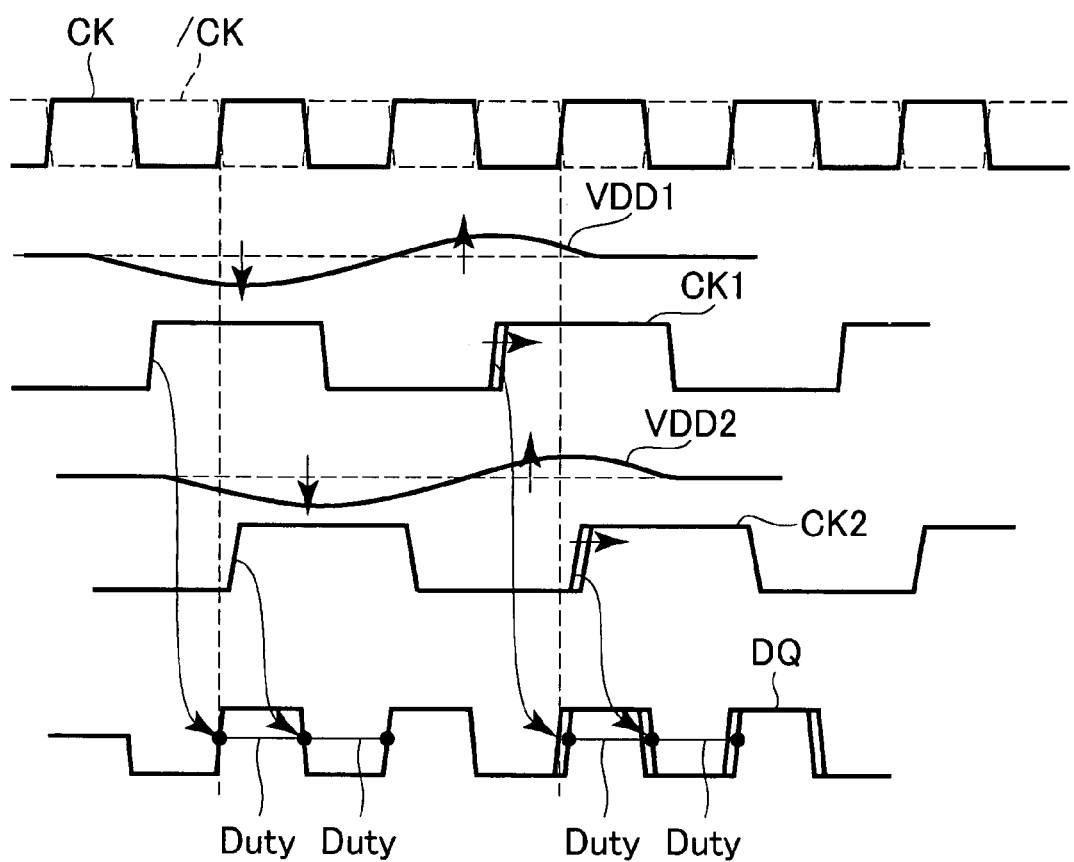
FIG. 6 is a timing chart for explaining a relationship between a fluctuation of the power supply voltage and the duty of the read data.

Particularly in a DDR synchronous DRAM, ensuring of the duty of read data is very important. As shown in FIG. 6, in the DLL circuit according to the present embodiment, when the power supply voltage VDD1 that is supplied to the clock driver 122 fluctuates, the power supply voltage VDD2 that is supplied to the clock driver 123 similarly fluctuates. Therefore, when the edge of the frequency-divided signal CK1 is delayed, the edge of the frequency-divided signal CK2 is similarly delayed. Accordingly, even when the power supply voltage fluctuates, the duty of read data outputted from the input/output data terminal DQ hardly becomes insufficient.

The semiconductor device according to the present invention can be a semiconductor memory device such as a DRAM, for example.

Figure 8:
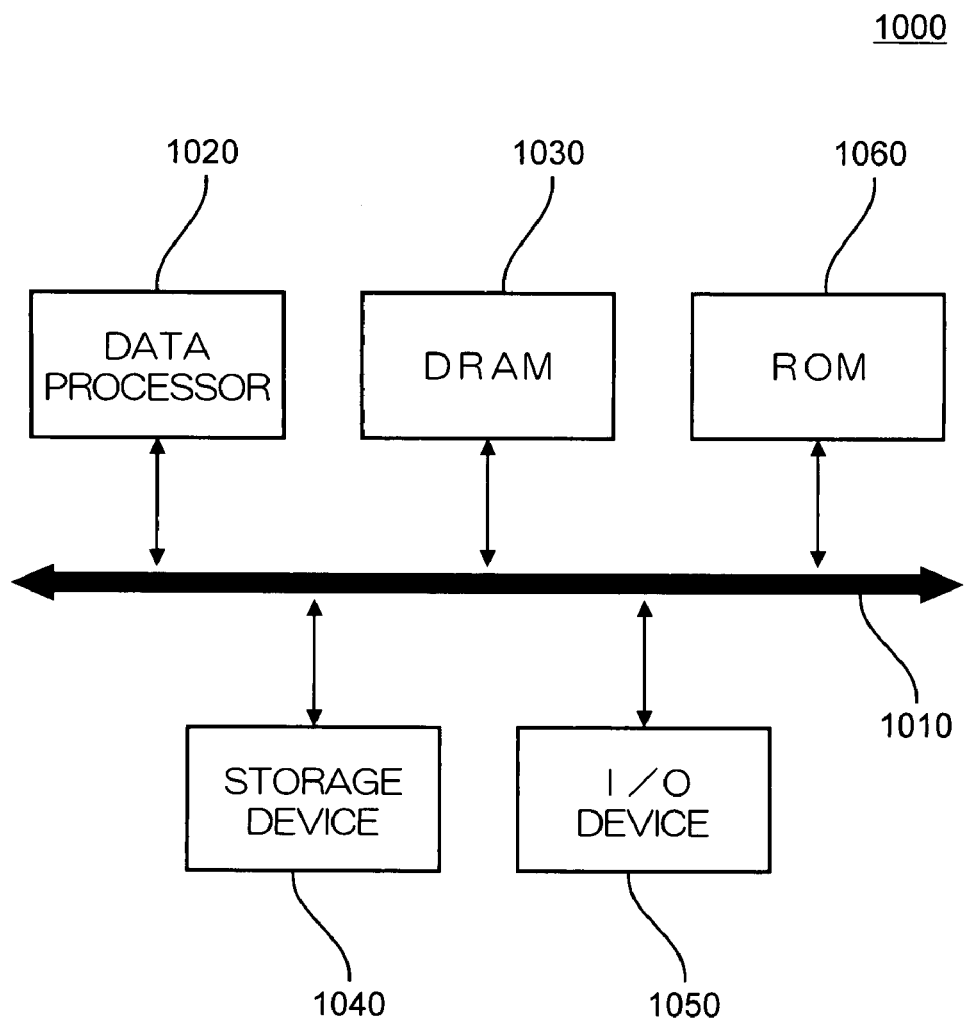
FIG. 8 is a block diagram showing a configuration of a data processing system using a semiconductor memory device according to a preferred embodiment of the present invention.

FIG. 8 is a block diagram showing a configuration of a data processing system 1000 using a semiconductor memory device according to a preferred embodiment of the present invention. The semiconductor memory device according to the present embodiment is a DRAM.

The data processing system 1000 shown in FIG. 8 includes a data processor 1020 and a semiconductor memory device (DRAM) 1030 according to the present embodiment connected to each other via a system bus 1010. The data processor 1020 includes a microprocessor (MPU) and a digital signal processor (DSP) for example. However, the constituent elements of the data processor 1020 are not limited to these. In FIG. 8, while the data processor 1020 and the DRAM 1030 are connected to each other via the system bus 1010, to simplify the explanation, the data processor 1020 and the DRAM 1030 can be connected to each other via a local bus without via the system bus 1010.

While only one set of the system bus 1010 is drawn to simplify the explanation in FIG. 8, the system bus can be set in series or in parallel via the connector according to need. In the memory system data processing system shown in FIG. 8, a storage device 1040, an I/O device 1050, and a ROM 1060 are connected to the system bus 1010. However, these are not necessarily essential constituent elements of the invention.

The storage device 1040 includes a hard disk drive, an optical disk drive, and a flash memory. The I/O device 1050 includes a display device such as a liquid-crystal display, and an input device such as a keyboard and a mouse. The I/O device 1050 may be any one of the input device and the output device. Further, while each one constituent element is drawn in FIG. 8 to simplify the explanation, the number of each constituent element is not limited to one, and may be one or two or more.

The present invention is in no way limited to the aforementioned embodiments, but rather various modifications are possible within the scope of the invention as recited in the claims, and naturally these modifications are included within the scope of the invention.

For example, in the present embodiment, the case in which the present invention is applied to a two-phase DLL circuit is explained. However, the present invention is not limited to this case, and can be widely applied to multiphase DLL circuits.

What is claimed is:

1. A DLL circuit comprising:
   a dividing circuit unit that frequency-divides a first clock signal to generate at least first and second frequency-divided signals having different phases;
   a first delay adjusting circuit that adjusts an amount of delay of the first frequency-divided signal based on a first feedback signal;
   a second delay adjusting circuit that adjusts an amount of delay of the second frequency-divided signal based on a second feedback signal;
   a synthesizing circuit that synthesizes at least outputs of the first and second delay adjusting circuits to generate a second clock signal, and supplies the second clock signal to a real path in a clock tree unit;
   a first clock driver that receives the output of the first delay adjusting circuit and supplies the output to a replica path in the clock tree unit; and
   a second clock driver that receives the output of the second delay adjusting circuit, wherein
   the first clock driver and the second clock driver have substantially the same circuit configuration.

2. The DLL circuit as claimed in claim 1, wherein the second feedback signal indicates duty of the second clock signal.

3. The DLL circuit as claimed in claim 1, wherein the first feedback signal indicates a difference in edges of a third clock signal generated based on the first frequency-divided signal passed through the replica path and of the first clock signal.

4. A semiconductor device comprising a DLL circuit, an output buffer, and a replica buffer,
   the DLL circuit including:
   a dividing circuit unit that frequency-divides a first clock signal to generate at least first and second frequency-divided signals having different phases;
   a first delay adjusting circuit that adjusts an amount of delay of the first frequency-divided signal based on a first feedback signal;
   a second delay adjusting circuit that adjusts an amount of delay of the second frequency-divided signal based on a second feedback signal;
   a synthesizing circuit that synthesizes at least outputs of the first and second delay adjusting circuits to generate a second clock signal, and supplies the second clock signal to a real path in a clock tree unit;
   a first clock driver that receives the output of the first delay adjusting circuit and supplies the output to a replica path in the clock tree unit; and
   a second clock driver that receives the output of the second delay adjusting circuit, wherein
   the first clock driver and the second clock driver have substantially the same circuit configuration,
   the first feedback signal indicates a difference in edges of a third clock signal generated based on the first frequency-divided signal passed through the replica path and of the first clock signal,
   the output buffer outputs data synchronized with the second clock signal passed through the real path, and
   the replica buffer has substantially the same circuit configuration as the output buffer and outputs the third clock signal synchronized with the first frequency-divided signal passed through the replica path.

5. The semiconductor device as claimed in claim 4, further comprising a third delay adjusting circuit that is placed between the replica path and the replica buffer, and absorbs a difference between an operation speed of the output buffer and an operation speed of the replica buffer.

6. The semiconductor device as claimed in claim 5, further comprising a power-supply terminal that is externally supplied with power supply voltage,
   wherein a distance between the third delay adjusting circuit and the power-supply terminal is at least shorter then a distance between the first clock driver and the power-supply terminal.

7. A data processing system comprising a data processor and a semiconductor memory device connected to the data processor, wherein the semiconductor memory device includes a DLL circuit, an output buffer, and a replica buffer, the DLL circuit having:
   a dividing circuit unit that frequency-divides a first clock signal to generate at least first and second frequency-divided signals having different phases;
   a first delay adjusting circuit that adjusts an amount of delay of the first frequency-divided signal based on a first feedback signal;
   a second delay adjusting circuit that adjusts an amount of delay of the second frequency-divided signal based on a second feedback signal;
   a synthesizing circuit that synthesizes at least outputs of the first and second delay adjusting circuits to generate a second clock signal, and supplies the second clock signal to a real path in a clock tree unit;
   a first clock driver that receives the output of the first delay adjusting circuit and supplies the output to a replica path in the clock tree unit; and
   a second clock driver that receives the output of the second delay adjusting circuit, wherein
   the first clock driver and the second clock driver have substantially the same circuit configuration,
   the first feedback signal indicates a difference in edges of a third clock signal generated based on the first frequency-divided signal passed through the replica path and of the first clock signal,
   the output buffer outputs data synchronized with the second clock signal passed through the real path, and
   the replica buffer has substantially the same circuit configuration as the output buffer and outputs the third clock signal synchronized with the first frequency-divided signal passed through the replica path.

* * * * *